US011483256B2

United States Patent
Louri et al.

(10) Patent No.: US 11,483,256 B2
(45) Date of Patent: Oct. 25, 2022

(54) SYSTEMS AND METHODS FOR APPROXIMATE COMMUNICATION FRAMEWORK FOR NETWORK-ON-CHIPS

(71) Applicant: The George Washington University, Washington, DC (US)

(72) Inventors: Ahmed Louri, Vienna, VA (US); Yuechen Chen, Arlington, VA (US)

(73) Assignee: The George Washington University, Washington, DC (US)

(*) Notice: Subject to any disclaimer, the term of this patent is extended or adjusted under 35 U.S.C. 154(b) by 24 days.

(21) Appl. No.: 17/307,745

(22) Filed: May 4, 2021

(65) Prior Publication Data
US 2021/0344617 A1 Nov. 4, 2021

Related U.S. Application Data

(60) Provisional application No. 63/019,752, filed on May 4, 2020.

(51) Int. Cl.
*H04L 49/109* (2022.01)
*G06F 8/41* (2018.01)
*G06F 11/36* (2006.01)
*H03M 7/30* (2006.01)

(52) U.S. Cl.
CPC .................. *H04L 49/109* (2013.01)

(58) Field of Classification Search
CPC .... H04L 49/109; G06F 8/433; G06F 11/3604; H03M 7/6041
See application file for complete search history.

(56) References Cited

U.S. PATENT DOCUMENTS

| 10,705,805 | B1* | 7/2020 | Bosworth | G06F 8/34 |
| 2013/0111453 | A1* | 5/2013 | Kalogeropulos | G06F 8/4452 717/161 |
| 2017/0303114 | A1* | 10/2017 | Johansson | H04L 65/65 |
| 2019/0318288 | A1* | 10/2019 | Noskov | G06Q 10/04 |
| 2019/0341039 | A1* | 11/2019 | Bharadwaj | G06F 40/30 |
| 2020/0334019 | A1* | 10/2020 | Bosworth | G06F 40/186 |
| 2022/0067022 | A1* | 3/2022 | Mishra | G06F 16/906 |

OTHER PUBLICATIONS

Chen, Yuechen, and Ahmed Louri. "An online quality management framework for approximate communication in network-on-chips." In Proceedings of the ACM International Conference on Supercomputing, pp. 217-226. 2019.
Y. Chen, et al., "DEC-NoC: An Approximate Framework Based on Dynamic Error Control with Applications to Energy-Efficient NoCs", IEEE 36th International Conference on Computer Design, 2018, pp. 480-487.
"IEEE Standard for Floating-Point Arithmetic", IEEE Computer Society, IEEE Std 754™, 2008, 70 pgs.
Y. Chen, et al., "An Approximate Communication Framework for Network-On-Chips", IEEE Transactions on Parallel and Distributed Systems, vol. 31, No. 6, Jun. 2020, pp. 1434-1446.

* cited by examiner

*Primary Examiner* — Harry H Kim
(74) *Attorney, Agent, or Firm* — Blank Rome LLP

(57) ABSTRACT

Systems and methods are disclosed for reducing latency and power consumption of on-chip movement through an approximate communication framework for network-on-chips ("NoCs"). The technology leverages the fact that big data applications (e.g., recognition, mining, and synthesis) can tolerate modest error and transfers data with the necessary accuracy, thereby improving the energy-efficiency and performance of multi-core processors.

19 Claims, 21 Drawing Sheets

FIG. 3

```
Algorithm 1 Error Threshold Calculation (ETC)
1:  function ETC (Data_Dependency_Graph G, start_V)
2:      let Q be a queue
3:      start_V.error tolerance ← result error tolerance
4:      Q.enqueue(start_V)
5:      while Q is not empty do
6:          v ← Q.dequeue
7:          for all edges w in G.adjacentEdges(v) do
8:              error ← calculate_error(v.error_tolerance, v.operation)
9:              if w.error_tolerance == empty then
10:                 w.error_tolerance ← error
11:                 Q.enqueue(w)
12:             end if
13:             if w.error_tolerance > error then
14:                 w.error_tolerance ← error
15:             end if
16:         end for
17:     end while
18: end function
```

SYSTEMS AND METHODS FOR APPROXIMATE COMMUNICATION FRAMEWORK FOR NETWORK-ON-CHIPS

CROSS-REFERENCE TO RELATED APPLICATIONS

This application claims the benefit of priority of U.S. Application Ser. No. 63/019,752 filed May 4, 2020, the content of which is relied upon and incorporated herein by reference in its entirety.

GOVERNMENT LICENSE RIGHTS

This invention was made with government support under National Science Foundation, CCF-1812495, CCF-1740249, and CCF-1513923. The government has certain rights in the invention.

FIELD OF THE DISCLOSURE

The field of the disclosure relates to interconnect architecture for parallel computing chips, and more specifically but not exclusively relates to on-chip communication and more specifically to a high-performance, and energy-efficient interconnection architecture for parallel computing systems.

BACKGROUND OF THE DISCLOSURE

Network-on-chip has been widely used to connect multiple computer components, such as processors, memory, cores, and caches in a parallel computing system. With significant improvement in system performance through exploiting parallelism on parallel computing systems, the state-of-the-art on-chip interconnection network design can soon become a communication bottleneck and struggle to deliver packets in a power-ancient manner. Consequently, there is a need for innovative power and latency reduction techniques for future network-on-chip designs.

Recent research shows that several big data applications, such as pattern recognition, image processing, and scientific computing, can tolerate modest errors while yielding acceptable results. However, conventional network designs for multicore processors transmit all data with absolute accuracy, which is unnecessary for such approximate computing applications. Transmitting data with excessive accuracy consumes excess power and increases the network latency. These observations suggest new design space in which data accuracy can be sacrificed to some extent to achieve better network performance.

The present disclosure describes methods for leveraging the error-tolerance of the applications to enhance NoC performance with improved power and network latency. Simulation results shows that our invention achieves up to 62% and 43% reduction on network latency and dynamic power consumption, respectively, when compared to the conventional NoC design.

SUMMMARY OF THE DISCLOSURE

The objectives of this disclosure include: (1) improving network performance and power-efficiency by using packet approximation technique; and (2) ensuring the quality of results, which generated by the application.

The disclosure presents an approximate communication framework to trade data quality for more efficient on-chip communication. The proposed framework decreases the size of transmitted data to reduce the consumption of time and power by on-chip communication. The proposed framework incorporates a hardware-software co-design to decrease network power consumption and latency while ensuring a necessary result quality. On the software side, the framework automatically identifies error-resilient variables in the application and calculates the error tolerance for the variables. On the hardware side, we augment the conventional network interface with approximate data compression and data decompression modules to reduce packet size. As a result, the proposed framework significantly reduces the network latency and dynamic power consumption compared to conventional NoC designs while meeting the application's requirements of result quality.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 3 shows an exemplary algorithm for error threshold calculation used by the software;

DETAILED DESCRIPTION OF THE PREFERRED EMBODIMENTS

Figure 1:
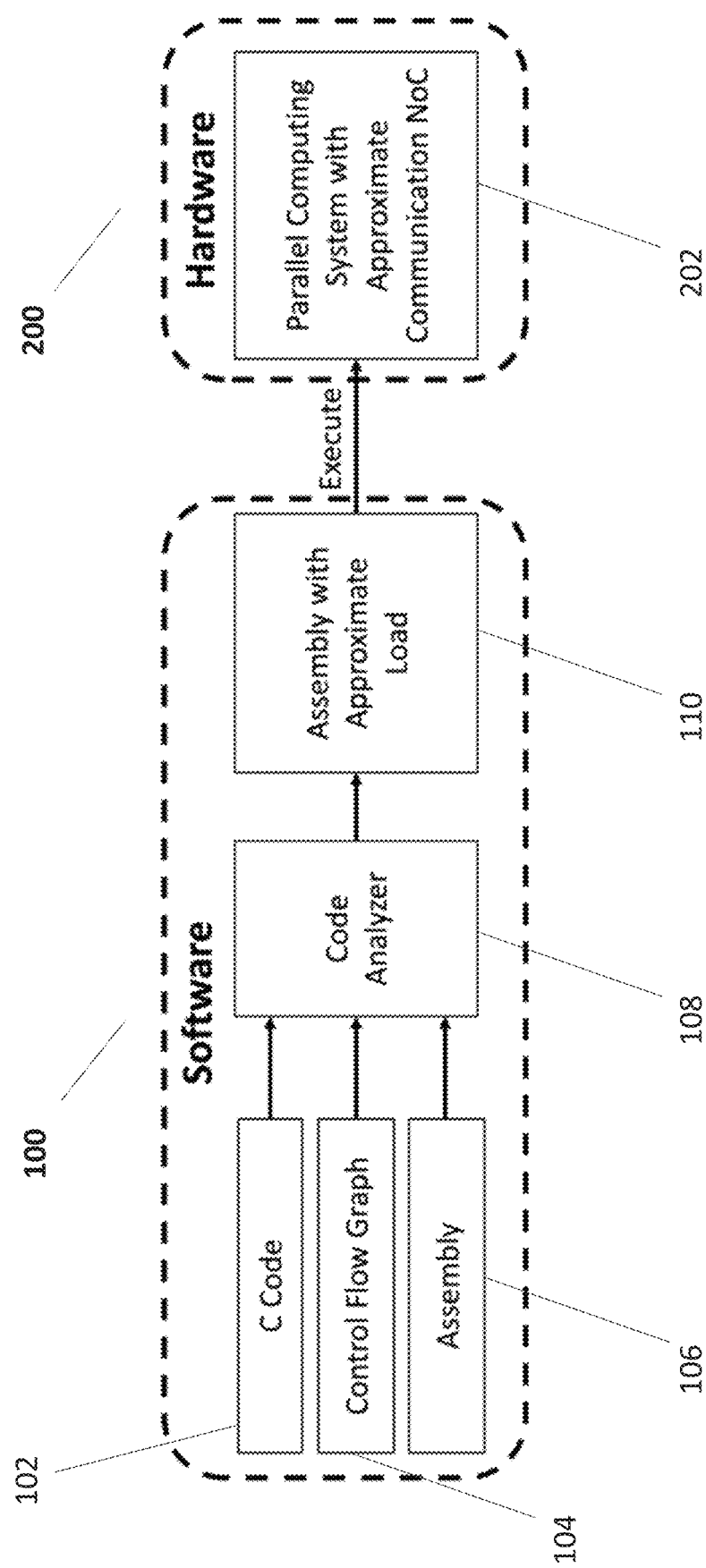
FIG. 1 illustrates the high-level workflow of the system in accordance with an exemplary embodiment.

In describing a preferred embodiment of the disclosure illustrated in the drawings, specific terminology will be resorted to for the sake of clarity. However, the disclosure is not intended to be limited to the specific terms so selected, and it is to be understood that each specific term includes all technical equivalents that operate in a similar manner to accomplish a similar purpose. Several preferred embodiments of the disclosure are described for illustrative purposes, it being understood that the disclosure may be embodied in other forms not specifically shown in the drawings.

Described herein are embodiments of an approximate communication system in which the data in a packet are compressed based on the error tolerance of the application to reduce power consumption and five-network latency. The approximate communication framework described herein includes a software-based quality control method and a hardware-based data approximation method implemented in the network interface (NI).

The high-level workflow of the system is exemplarily shown in FIG. 1. The approximate communication system is comprised of a software 100 component and a hardware 200 component. The software 100 is further comprised of C (source) code 102, a control flow graph 104 ("CFG"), assembly code 106, a code analyzer 108, and assembly code with approximate load 110. As will be explained in greater detail below, the code analyzer 108 needs three files to operate: the source code 102, the CFG 104, and the assembly code 106. The hardware 100 of the system which is used to execute the software 100, is preferably comprised of a parallel computing system with an approximate communication network on-chip ("NoC") 202.

Before the execution of the application, the quality control method uses the code analyzer 108 to identify error-resilient variables and calculate the error tolerance of each variable based on the application's quality requirement on results. The software of the code analyzer preferably runs prior to the execution of the approximation application on the multi-core processor, as exemplarily shown in FIG. 5 below. The error-resilient variables comprise a subset of the data generated from the execution of the source code 102, the CFG 104, and/or the assembly code 106. New instructions are introduced, namely approximate load and store, to indicate error-resilient variables with error tolerance values it the assembly code. When an approximate load 110 or store is executed, the network interface ("NI") compresses the data and generates an approximated packet based on the error tolerance of the variable, using the data approximation method of the present disclosure. As a result, the proposed approximate communication system decreases the amount of data transmitted, resulting in significant improvements in power consumption and network latency compared to conventional interconnection network designs.

Figure 2:
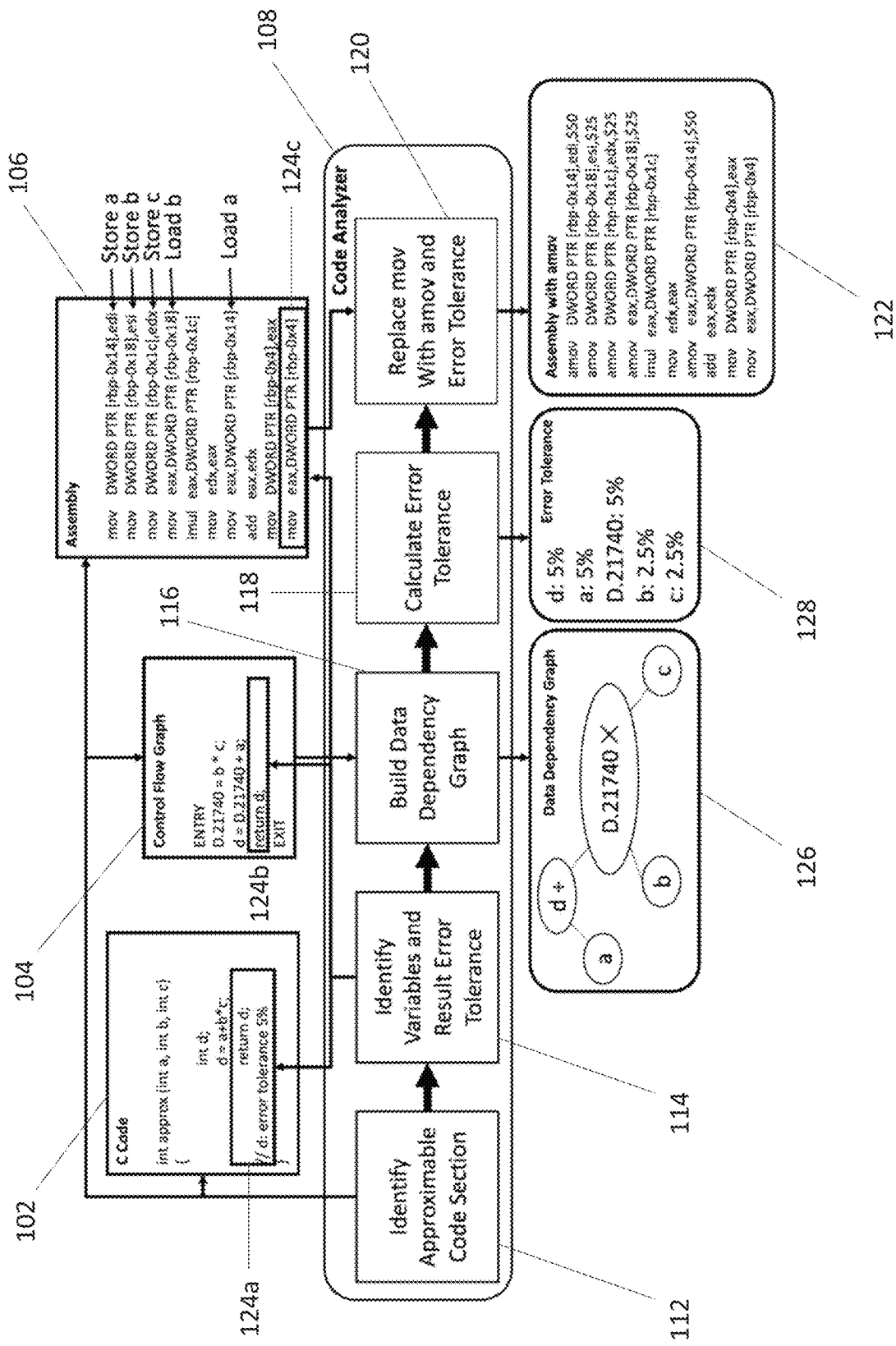
FIG. 2 illustrates the exemplary workflow of the code analyzer component of the software.

FIG. 2 shows an exemplary workflow of the code analyzer 108. One of the main functions of the code analyzer 108 is to identify the error-resilient values in the approximable code sections 112 and calculate the corresponding error tolerances based on the quality requirements of the application 114. To achieve this goal, the code analyzer 108 needs to analyze the syntax of the source code 102 and break down all operations into basic operations (addition, subtraction, multiplication, and division). Notably, the compiler can generate a control flow graph (CFG) 104 that describes the function of the source code 102 in terms of basic operations. As a result, the code analyzer 108 requires three files to operate: the source code 102, the CFG 104, and the assembly code 106. First, the code analyzer 108 searches for approximable functions in the C code 102, CFG 104, and assembly code 106. Exemplary approximable functions are shown in the C code 102, the CFG, and the assembly code 106. While C code is discussed here, one of ordinary skill in the art would readily understand that code in other programming languages (e.g. Java, BASIC, etc.) is also within the scope of this disclosure. As used herein, "approximable" refers to those variables that the code analyzer 108 determines can tolerate error. If the code analyzer 108 determines that the that a variable cannot tolerate error within predetermined thresholds, that variable will not be modified.

Second, the code analyzer identifies all variables and results in the approximable section 114 in the C code 102, CFG 104, and assembly code 106. In FIG. 2, the result and the result quality for this example are highlighted in boxes 124a, 124b, 124c. The mov operation on variable a, b and c in the assembly code 110 is also identified using arrows, listing "Store a," "Store b," "Store c," "Load b," and "Load a." Those of ordinary skill in the art will understand that the mov operation, from the X86 instruction set (https://www.intel.com/content/dam/www/public/us/en/documents/manuals/64-ia-32-architectures-software-developer-instruction-set-reference-manual-325383.pdf), is described exemplarily in the present disclosure, and those of ordinary skill would readily understand that other processors, such as ARM and RISC-V, can also use the technology of the present disclosure to identify approximable variables.

Third, the analyzer builds a data dependency graph 116, which shows the calculation process for each variable, based on the CFG 104. For the example in FIG. 2, the intermediate variable D.21740 is equal to the product of b and c and that the result d is equal to the sum of a and D.21740 126.

Fourth, the code analyzer 108 traverses the data dependency graph and updates the error threshold for each variable 118. The calculated error thresholds 128 are highlighted in the box in FIG. 2. The error threshold for each intermediate data value is exemplarily calculated using Algorithm 1, as shown in FIG. 3. The error threshold calculation (ETC) algorithm traverses the data dependency graph in a manner similar to that of breadth-first search (BFS). Different from the conventional BFS algorithm, at line 13, the error tolerance is allowed to be updated when the current error tolerance is smaller than the previous one to prevent erroneous calculation results. The error tolerance for each variable is calculated based on the error tolerance for the result and the various operations are applied, as exemplarily explained below and outlined in: Yuechen Chen, Ahmed Louri, "Approximate Communication Framework for Network-on-Chips", *IEEE Transactions on Parallel and Distributed Systems*, vol. 31, no. 6, pp. 1434-1446, 2020, the contents of which are incorporated herein by reference.

Equation 1 shows the definition of error tolerance, where $\tilde{a}$ is approximated a and $E_r$ is relative error:

$$E_r = \frac{|a - \tilde{a}|}{a} \leq \text{error tolerance} \tag{1}$$

Equation 2 describes the addition and subtraction of $\tilde{a}$ and $\tilde{b}$, where $\tilde{a}$ and $\tilde{b}$ are transmitted through approximate communication and $\tilde{c}$ is the result $$\tilde{c} = \tilde{a} \pm \tilde{b} \tag{2}$$

Using Equation 1, the following calculations are performed, as shown below:

$$E_{rc} = \frac{|c - \tilde{c}|}{c} \leq \text{error tolerance} \tag{3}$$

$$\tilde{a} = a + E_{ra} \times a \tag{4}$$

$$\tilde{b} = b + E_{rb} \times b \tag{5}$$

When a and b have the same relative error ($E_{ra} = E_{rb} = E_{rab}$), Equations 2, 4, and 5 can be combined to arrive at Equation 6 below:

$$\tilde{c} = (a + E_{rab} \times a) \pm (b + E_{rab} \times b) \tag{6}$$

By combining Equations 3 and 11 with c=a±b, it can be determined that the relative error ($E_{rab}$) for a and h are equal to the relative error ($E_{rc}$) for c. Therefore, $E_{rc} \leq$ error tolerance is ensured when $E_{rab} \leq$ error tolerance for the addition and subtraction operation. For example, $\tilde{a}$ and $\tilde{b}$ can each contain less than 5 percent relative error when $\tilde{c}$ can tolerate 5 percent relative error. Equation 7 describes the multiplication of $\tilde{a}$ and $\tilde{b}$, where $\tilde{a}$ and $\tilde{b}$ are transmitted through approximate communication and $\tilde{c}$ is the result:

$$\tilde{c} = \tilde{a} \pm \tilde{b} \tag{7}$$

With the same theory, Equation 8 can be calculated for the multiplication, where a and b are fully accurate variable and $E_{rab}$ is relative error:

$$\tilde{c}=(a+E_{rab}*a)*(b+E_{rab}8b) \quad (8)$$

By combining Equations 3 and 8, with c=a×b, it can be determined that for the multiplication operation, $E_{rc}=(1+E_{rab})^2-1$. Therefore, $E_{rc} \leq$ error tolerance is ensured when $-1+\sqrt{1+E_{rab}} \leq$ error tolerance for the multiplication operation. For example, ã and b̃ can each contain less than 2.5 percent relative error when c̃ can tolerate 5 percent relative error. Equation 9 then describes the division of ã and b̃, where ã and b̃ are transmitted through approximate communication and c̃ is the result:

$$\tilde{c}=\tilde{a}/\tilde{b} \quad (9)$$

For the division operation, Equation 10 is calculated, where a and b are fully accurate variables and $E_{ra}$, $E_{rb}$ are relative error:

$$\tilde{c}=(a+E_{rab}*a)/(b+E_{rab}8b) \quad (10)$$

Finally, the code analyzer selects and replaces the mov instructions in the assembly code with approximate mov instructions 120. The selected mov instructions load and store the variable, which locates at the leaf of the data dependency graph (e.g. a, b, c). A new type of approximate load and store instruction (amov, dist, src, error threshold) is introduced into the X86 instruction set for the network to compress approximable packets. The error threshold in the amov instruction is multiplied by 103 to eliminate the decimal point. The final result 122 is shown in FIG. 2, where "50" indicates a 5% error tolerance and "25" indicates a 2.5% error tolerance.

Figure 4:
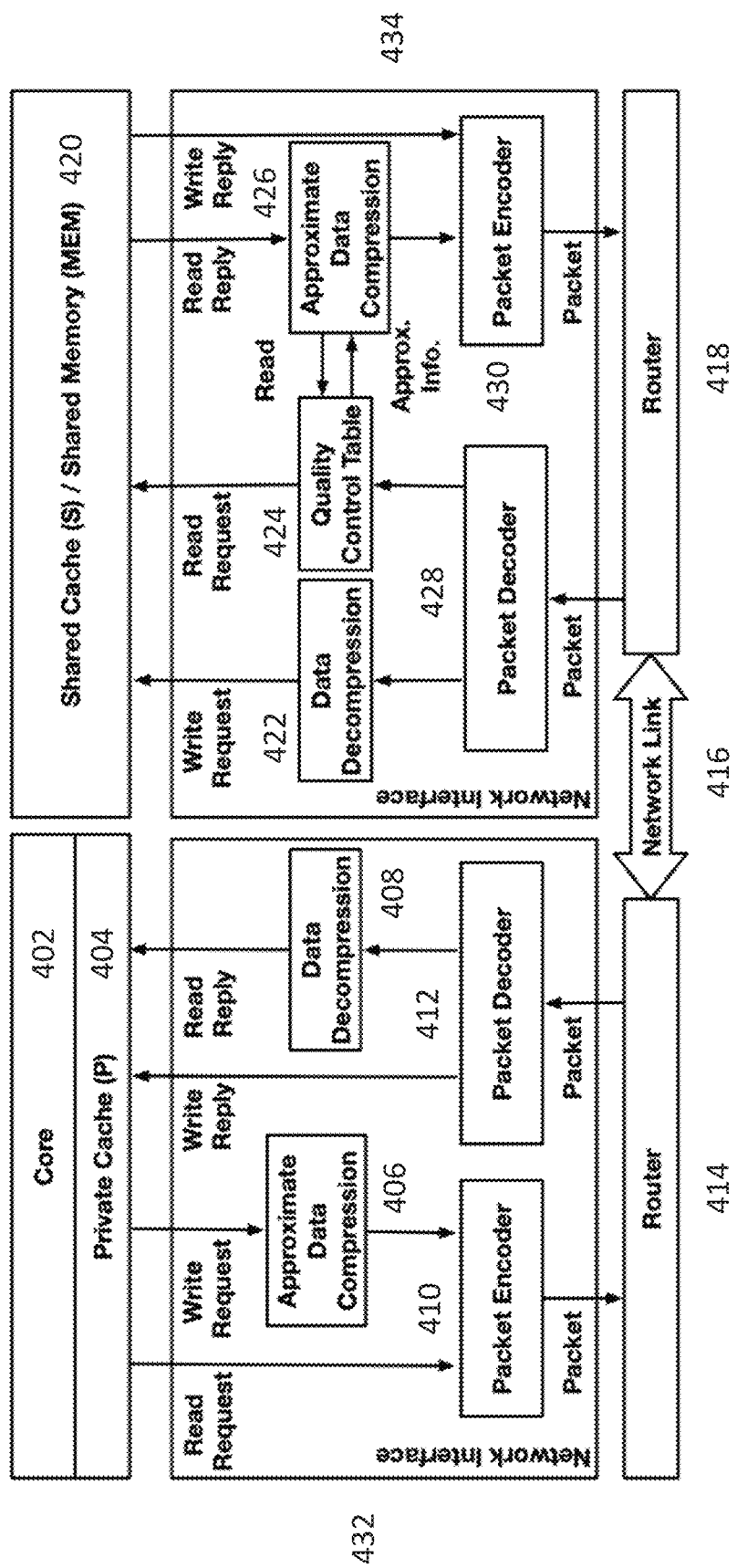
FIG. 4 illustrates an exemplary architecture design of the approximate communication system.

FIG. 4 presents a high-level overview of an exemplary approximate communication system along with the hardware design. In certain embodiments, the system operates as follows. At the core 402, when a cache miss is caused by an approximate store operation, a write request is generated by the private cache 404 with the approximation information. The approximation information includes the address, data type (e.g. integer, floating point, etc.), and error tolerance. The write request is compressed by the approximate data compression logic 406 at the core and private cache node based on the error tolerance of the data. Then, the write request is encoded by the packet encoder 410 at the network interface 432 and injected into the network, where it travels through one or more routers in the on-chip network. Upon reaching the router 418 of the shared cache/shared memory node 420, the write request packet passes through the network interface 434, a packet decoder 428, and a data decompression module 422. When the shared cache or shared memory node 420 receives the write request packet, the data decompression module 422 recovers the truncated data and adds zeros to the truncated part to maintain the original data format. Then, the write request is sent to the shared cache or shared memory 420, and a write replay is generated and transmitted to the core 402 and private cache node 404 to confirm the transmission.

The data compression process by the approximate data compression logic 406 is exemplarily outlined herein. The first step is to truncate the integer or floating point data based on the error tolerance. In this paper, we define the error tolerance as the maximum relative error that a data can accept. As shown above, Equation 1 shows the definition of error tolerance, where ã is approximated a and $E_r$ is relative error.

Equations 11 and 12 show the representation of single precision floating point value based in IEEE 754 standard (IEEE Standards Committee et al., 754-2008 *IEEE Standard for Floating-Point Arithmetic, IEEE Computer Society Standard* 2008:517, 2008).

$$\text{float} = (-1)^S \times \text{mantissa} \times 2^{exp} \quad (11)$$

$$\text{mantissa} = 2^0 + \sum_{k=1}^{23} X_k 2^{-k} (X_k = 0 \text{ or } 1) \quad (12)$$

Based on Equations 11 and 12, the mantissa always starts with one. According to the IEEE 754 standard, when a data point is represented in the floating point format, the first bit of the mantissa is omitted. We observe that when c bits (of the 23-bit mantissa) are protected, the maximum relative error on this floating point data value will be $\Sigma_{k=c+1}^{23} 2^{-k}$, which is $2^{-c}$ according to the sum of the geometric sequence ($\Sigma_{k=1}^n ar^{k-1} = a(1-r^n)/1-r$, where a is the first term, n is the number of term, and r is the common ratio in the sequence). Therefore, using Equation 12, the following expression for the data error tolerance can be deduced, as shown in Equation 13:

$$\text{error tolerance} = 2^{-n} (1 \leq n \leq 23) \quad (13)$$

In Equation 13 above, the data error tolerance is a number between 0 and 1, and n is the number of most significant bits (MSBs) in the mantissa of this floating point value. In a floating point data value, the 1-bit sign and the 8-bit exponent (a total of 9 bits) are also critical bits, which must be transmitted. Thus, by truncating 23−n bits, we can ensure the value's relative error is less than $2^{-n}$. For example, to satisfy a data error tolerance of 10 percent for any floating point value, we can truncate 18 least significant bits (LSBs), resulting in a maximum relative error of 6.25 percent. Equation 14 shows the representation of a signed integer. In a signed integer, the MSB represents the sign, and the remaining 31 bits represent the value:

$$\text{int} = \sum_{k=0}^{31} X_k 2^k (X_k = 0 \text{ or } 1) \quad (14)$$

We observe that when n bits (of the 31 LSBs) are truncated, the maximum error caused by truncation will be $\Sigma_{k=0}^n X_k 2^k$ ($X_k$=0 or 1). Thus, Equation 15 below can be used to calculate the number of bits (n) to be truncated for a given error tolerance:

$$\text{error tolerance} = \frac{\sum_{k=0}^{n} X_k 2^k}{\sum_{k=0}^{31} X_k 2^k} (X_k = 0 \text{ or } 1) \quad (15)$$

With this data truncation method, an integer with a small absolute value requires a larger number of MSBs to achieve the same error threshold than is required for an integer with a large absolute value. For example, for an integer value of 100, 29 MSBs need to be transmitted to ensure 5 percent error tolerance. On the other hand, for an integer value of 5,418, only 28 MSBs need to be transmitted to achieve the same data error tolerance (5 percent). To overcome this problem, we compress the data using the frequent data pattern compression method. In previous research, the frequent data pattern compression mechanism (Table 1) has been proposed and extended to NoCs with a low-overhead compression and decompression mechanism.

TABLE 1

Frequent Pattern Encoding

| Code | Pattern Encoded | Data Size After Encoding |
|---|---|---|
| 000 | Zero run | 3 bits |
| 001 | 4-bit sign-extended | 4 bits |
| 010 | 1-byte sign-extended | 8 bits |
| 011 | Halfword sign-extended | 16 bits |
| 100 | Halfword padded with a zero halfword | 16 bits |
| 101 | Two half words, each 1-byte sign-extended | 16 bits |
| 111 | Uncompressed word | 32 bits |

That mechanism is adopted in certain aspects of the present disclosure to compress approximated data. The essence of frequent data pattern compression method is to eliminate zeros and ones in the MSBs and LSBs for both integer and floating value without effecting the accuracy of the value. We develop a frequent pattern replacement table based on Table 1. Table 2 shows the static set of frequent patterns and the codes. In this table, the notation X represents a bit that can be either 0 or 1.0xff and 0x00 are two hexadecimal numbers, which represent eight 1-bits and eight 0-bits. The data compressor checks every piece of data and attempts to match its pattern. If the pattern matches, the data compressor will replace the pattern with the corresponding code. The 0 or 1 represented by X will not be changed during the compression process.

TABLE 2

| Code | Frequent Pattern | | | |
|---|---|---|---|---|
| 000 | 0x00 | 0x00 | 0x00 | 0x00 |
| 001 | 0x00 | 0x00 | 0x00 | 00000xxx |
| | 0xff | 0xff | 0xff | 11111XXX |
| 010 | 0x00 | 0x00 | 0x00 | 0XXXXXXX |
| | 0xff | 0xff | 0xff | 1XXXXXXX |
| 011 | 0x00 | 0x00 | 0XXXXXXX | XXXXXXXX |
| | 0xff | 0xff | 1XXXXXXX | XXXXXXXX |
| 100 | XXXXXXXX | XXXXXXXX | 0x00 | 0x00 |
| 101 | 0x00 | 0XXXXXXX | 0x00 | 0XXXXXXX |
| | 0xff | 1XXXXXXX | 0xff | 1XXXXXXX |

When a cache miss is caused by approximate load operation, a read request is issued by the private cache 404 with the approximation information. Then, the read request is sent to the packet encoder 410 to generate a read request packet. The read request packet is injected into the network through the network interface 432, where it travels through multiple routers in the on-chip network. Upon reaching the router 418 of the shared cache/shared memory node 420, the read request packet passes through the network interface 434, a packet decoder 428, and a quality control table 424. When the shared cache or shared memory node 420 receives the read request, the approximation information is extracted from the packet and inserted into the quality control table 424. When the read reply is generated by the shared cache or shared memory 420, the approximate data compression logic 426 reads the approximation information in the quality control table and truncates the data in accordance with the approximation information. Then, the packet encoder 430 prepares the read reply packet and sends it to the router 418. The read reply packet is decoded at the packet decoder 412 and then arrives at the core 402 and private cache node 402, where the data decompression module 408 recovers the data.

Figure 5:
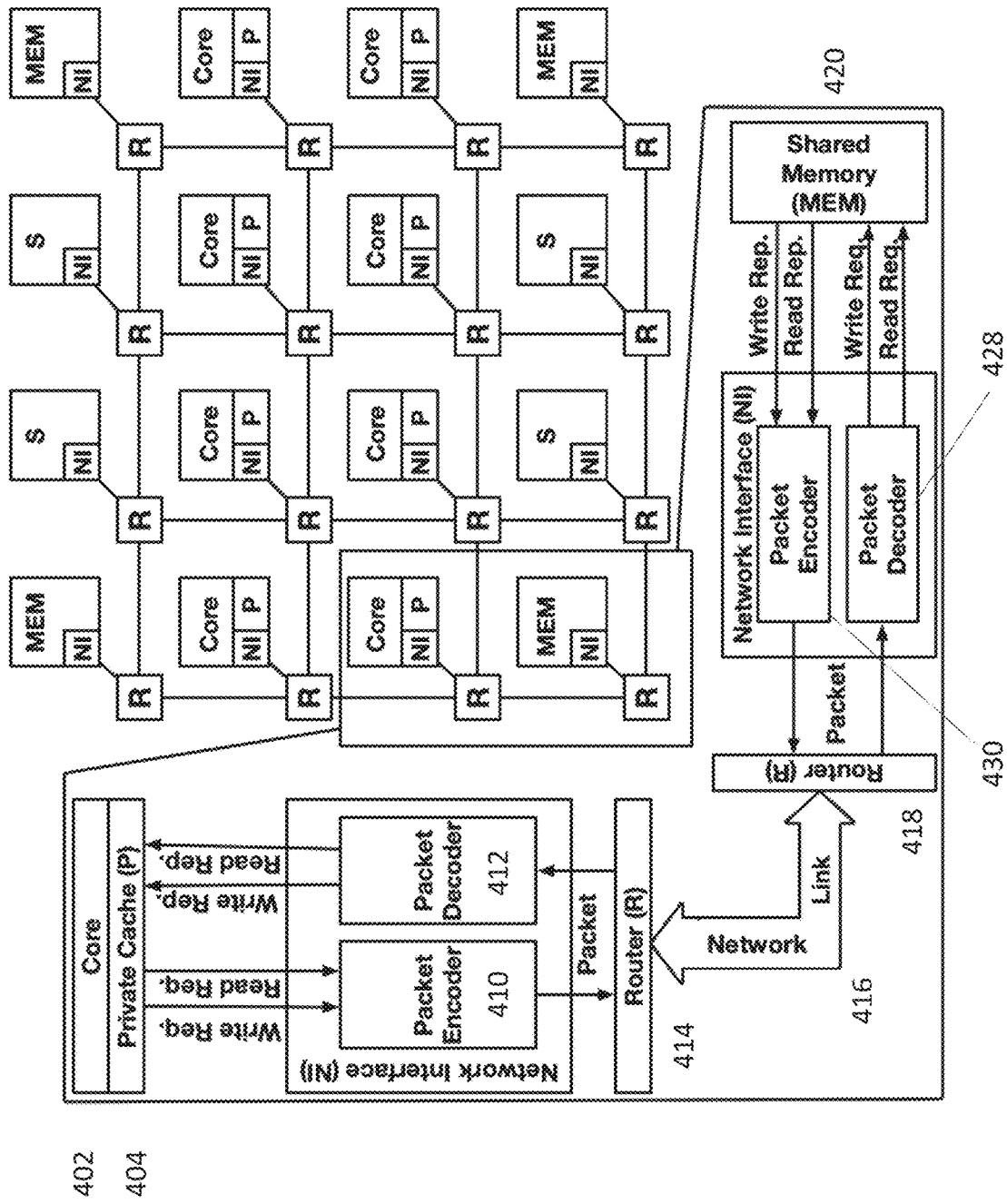
FIG. 5 is a diagram illustrating the design of the conventional network interface.

The baseline system is a multi-core processor, which is shown in FIG. 5. FIG. 5 is a zoomed-in, detailed view of two of the routers shown, designated "R." As shown in FIG. 5, the system includes a core 402, a private cache 404, a packet encoder 410, a packet decoder 412, a first router 414, a network link 416, a second router 418. In this simplified example, the first router 414, the network link 416, and the second router 418 comprise what can be considered the network. shared memory 420. FIG. 4, showing the approximate communication system of the present disclosure, is modified to include such additional components as: the approximate data compression logic module 406/426, the data decompression logic module 408/422, and a quality control table 424.

Figure 6A:
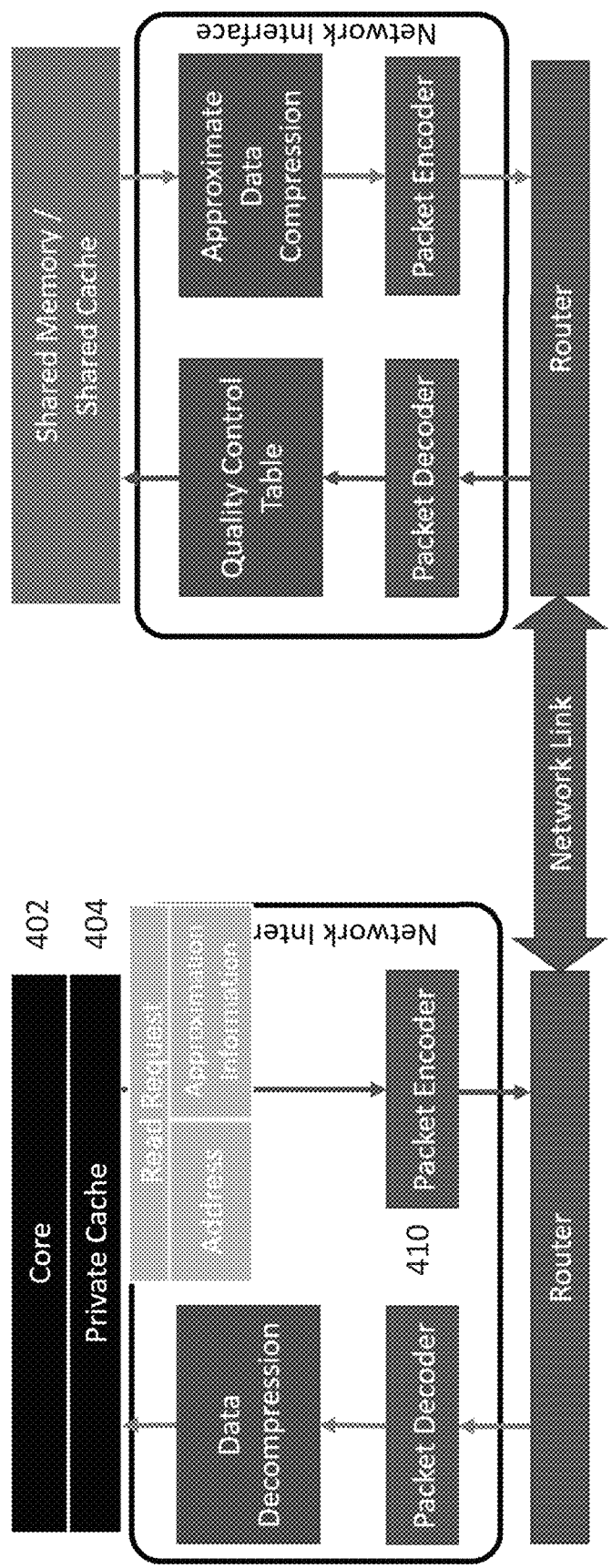
FIG. 6A-6O illustrate an exemplary method applied by the architecture design of the approximate communication system.
Figure 6B:
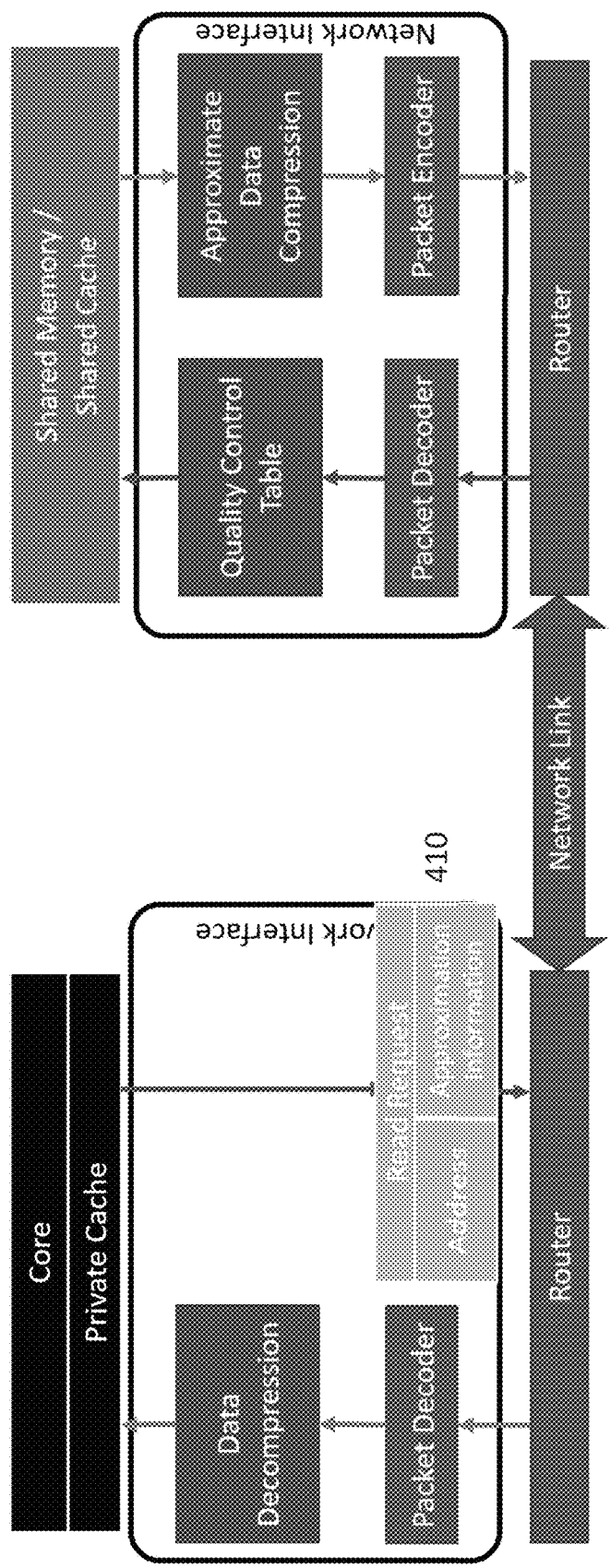
Figure 6C:
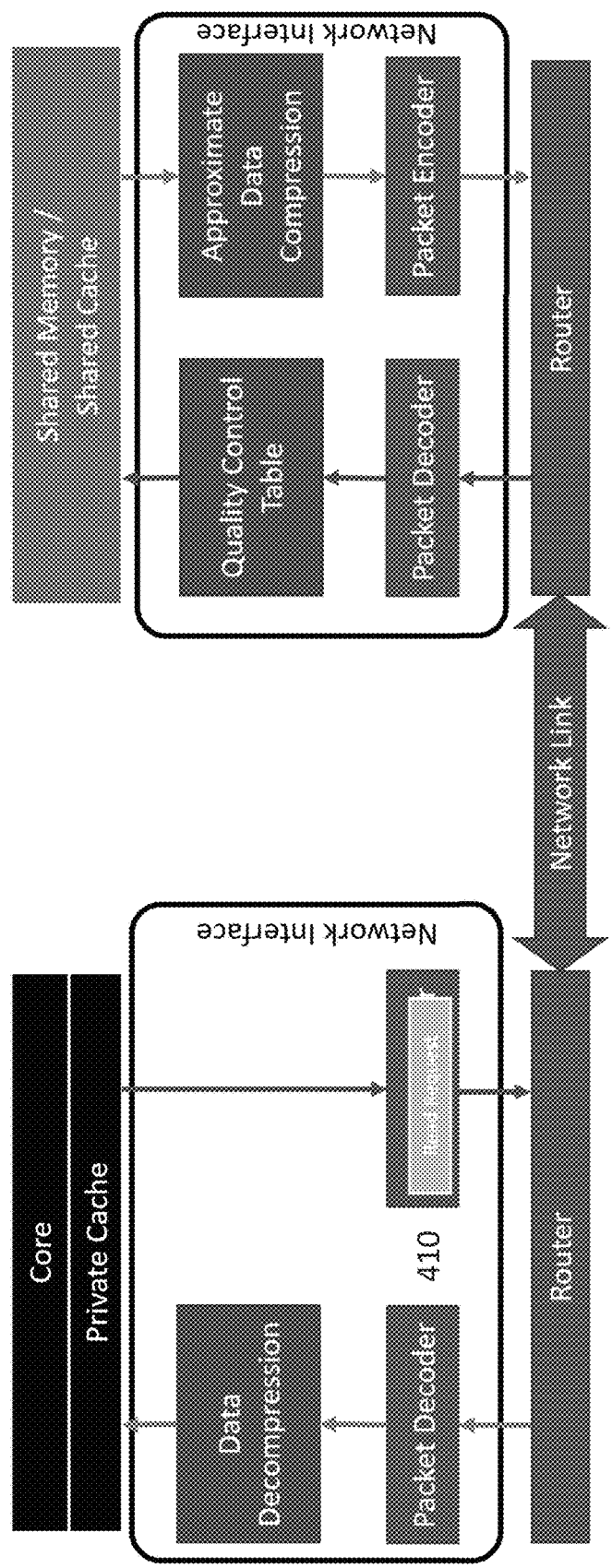
Figure 6D:
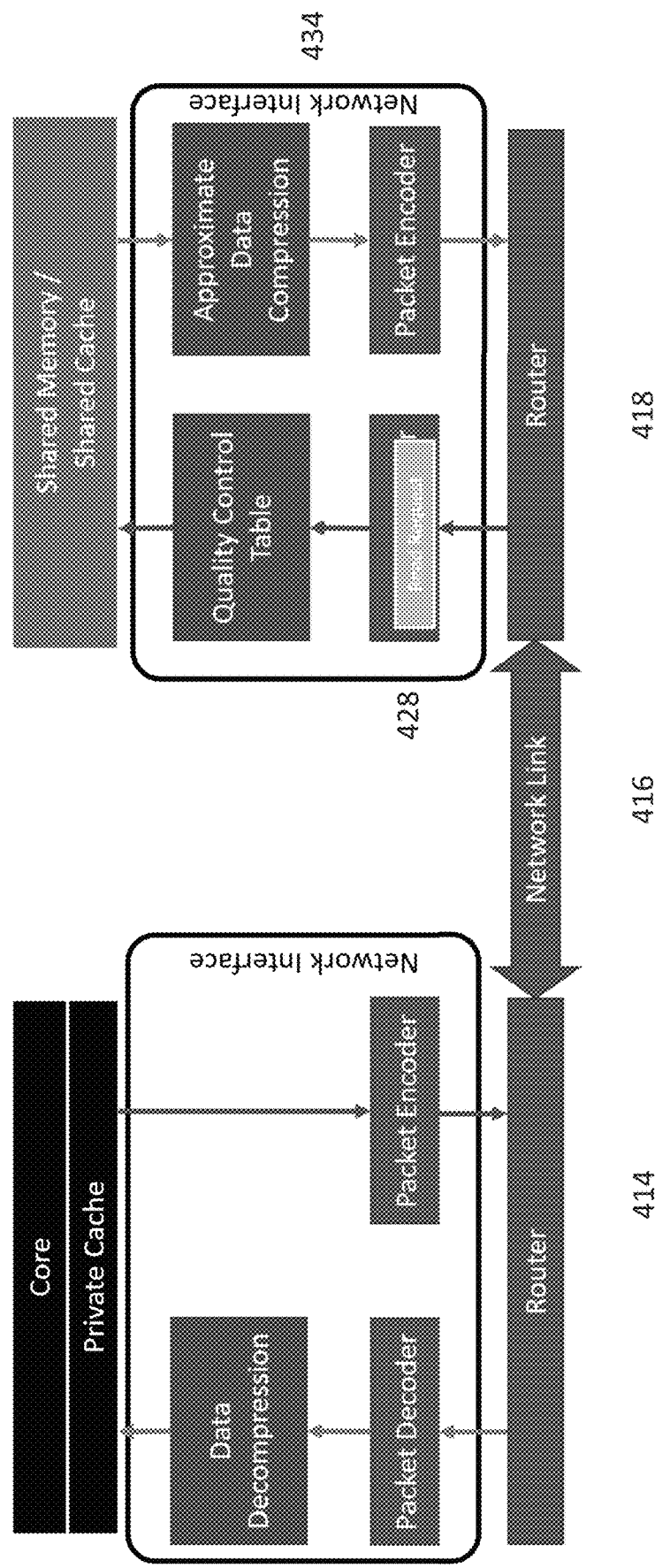
Figure 6E:
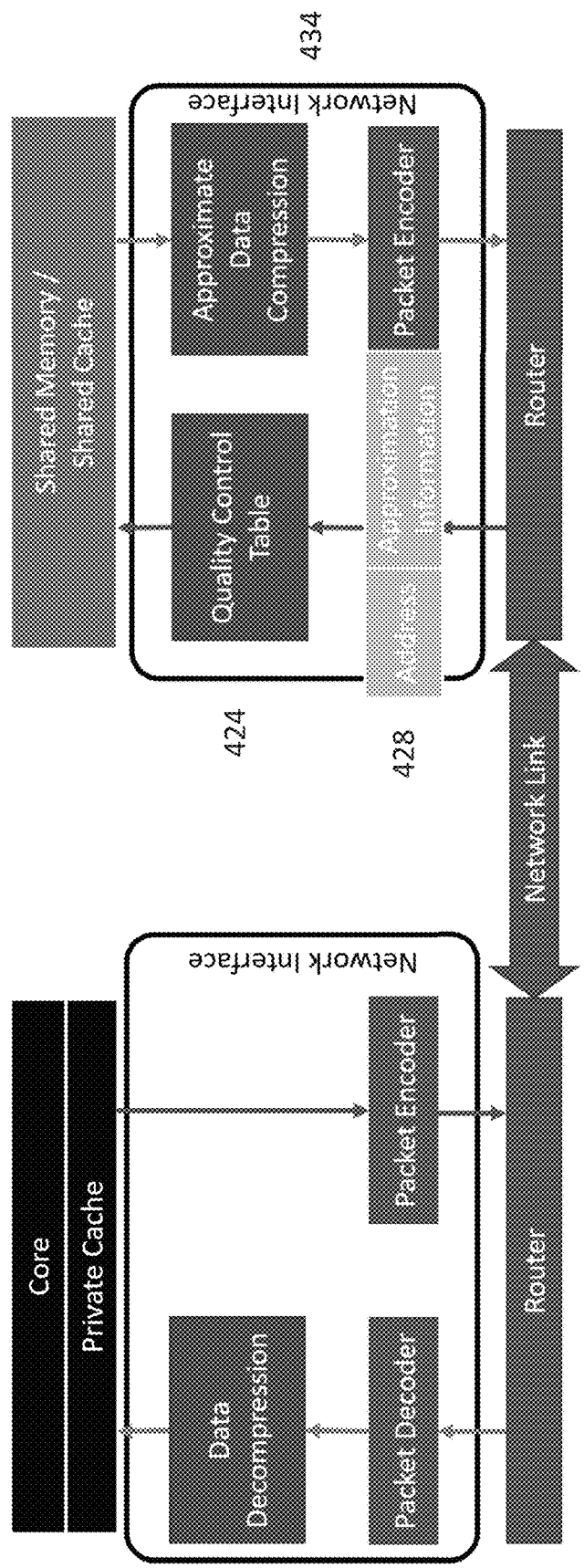
Figure 6F:
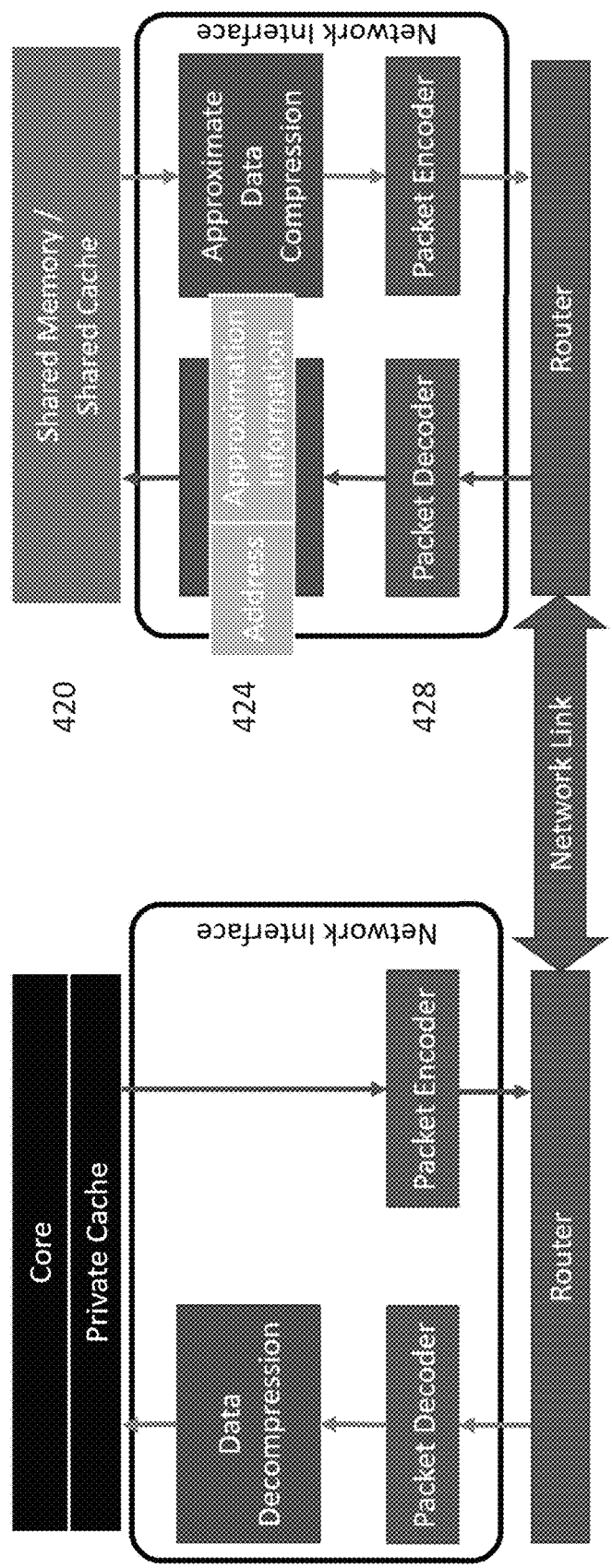
Figure 6G:
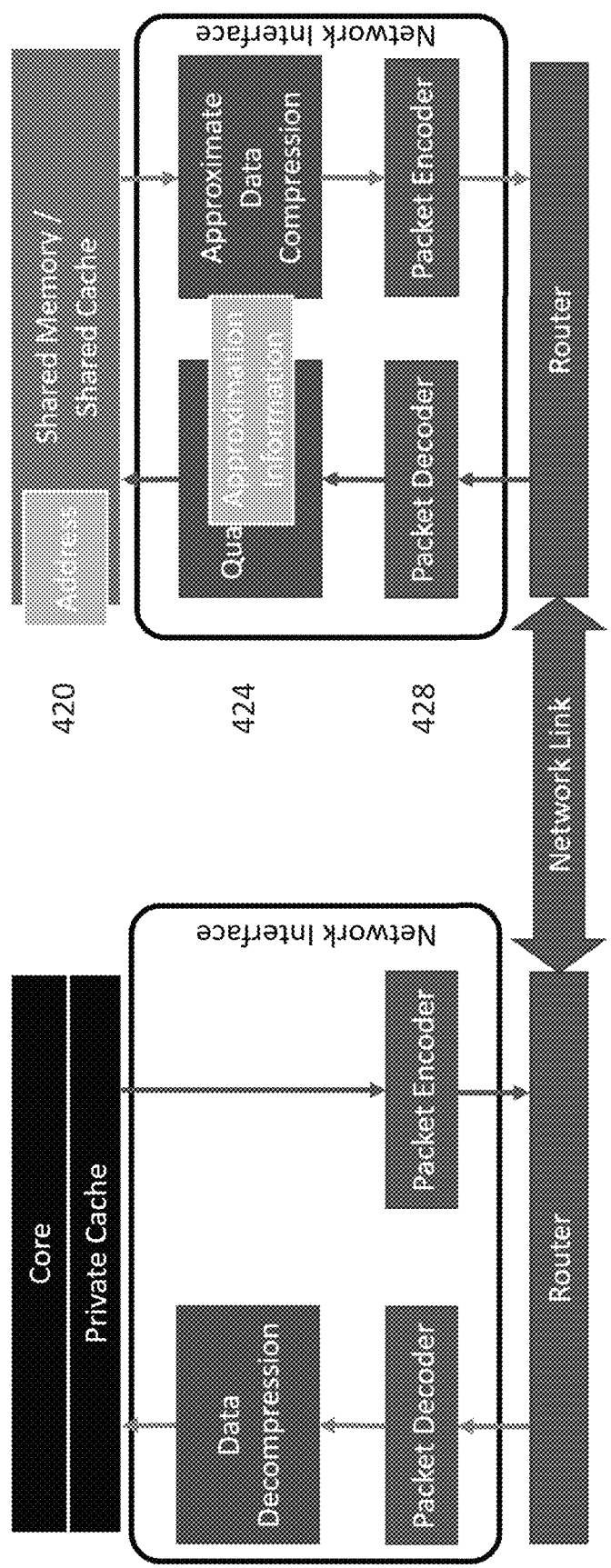
Figure 6H:
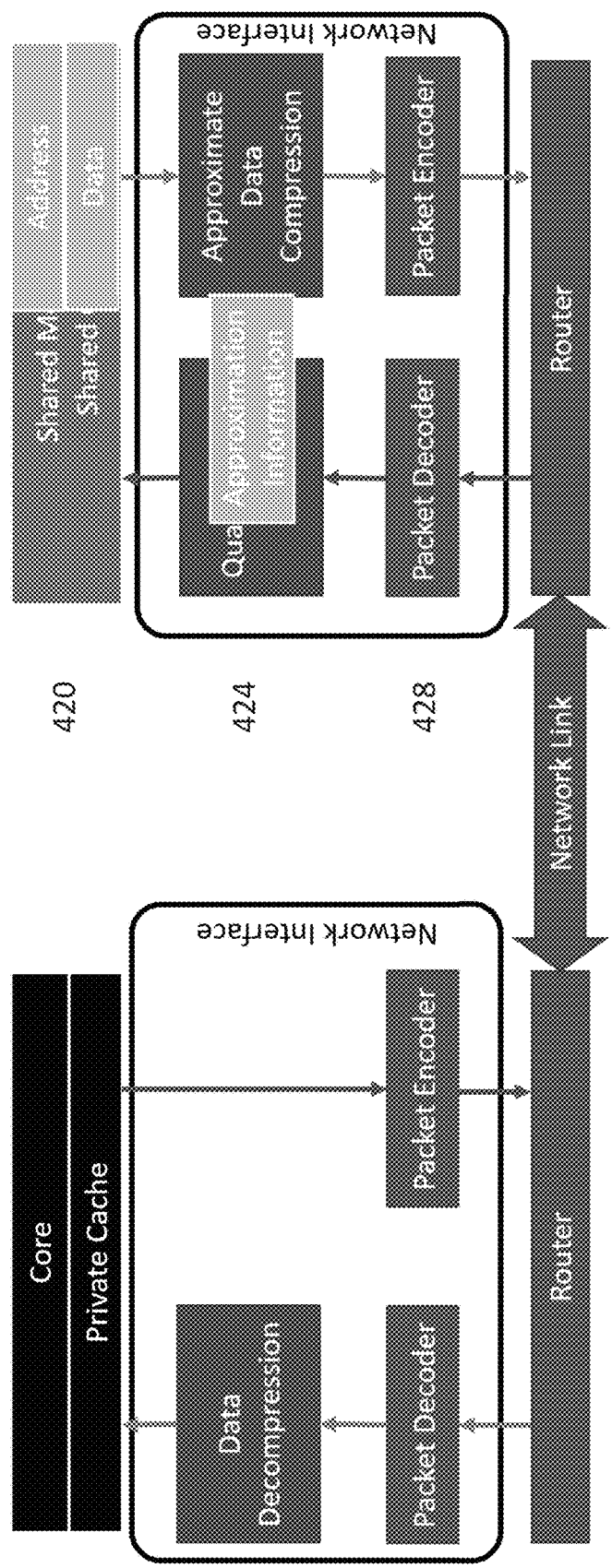
Figure 6I:
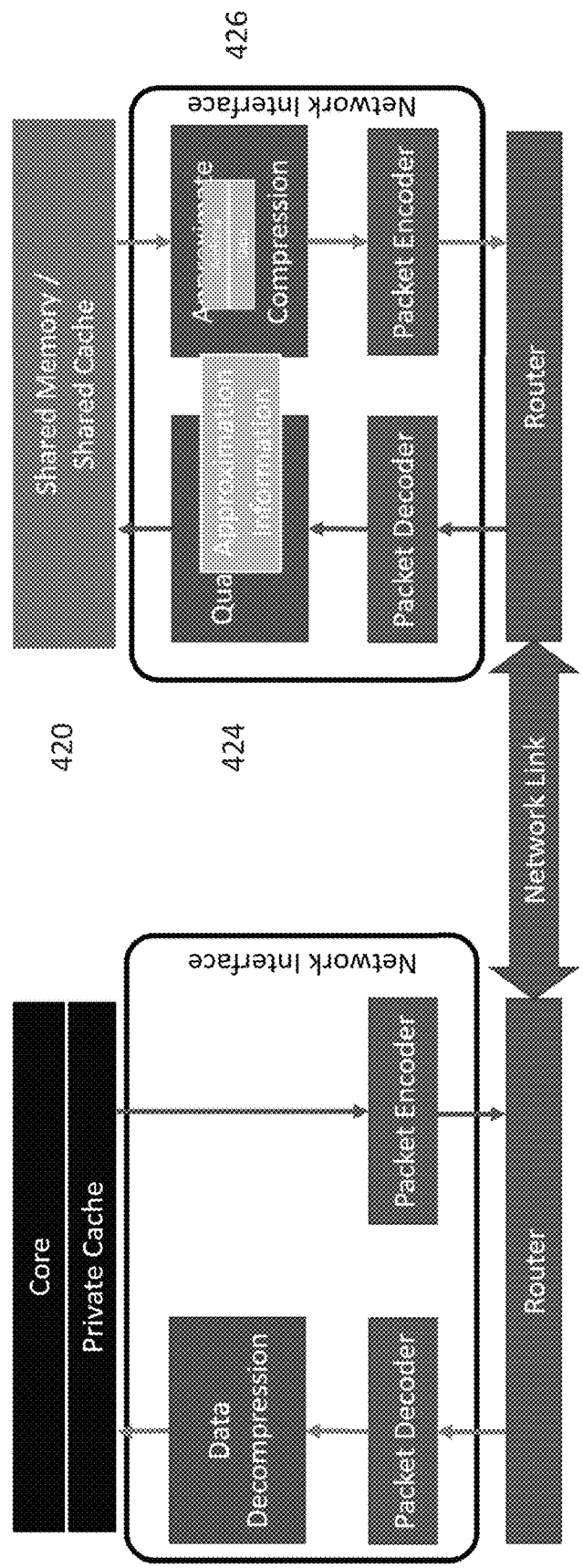
Figure 6J:
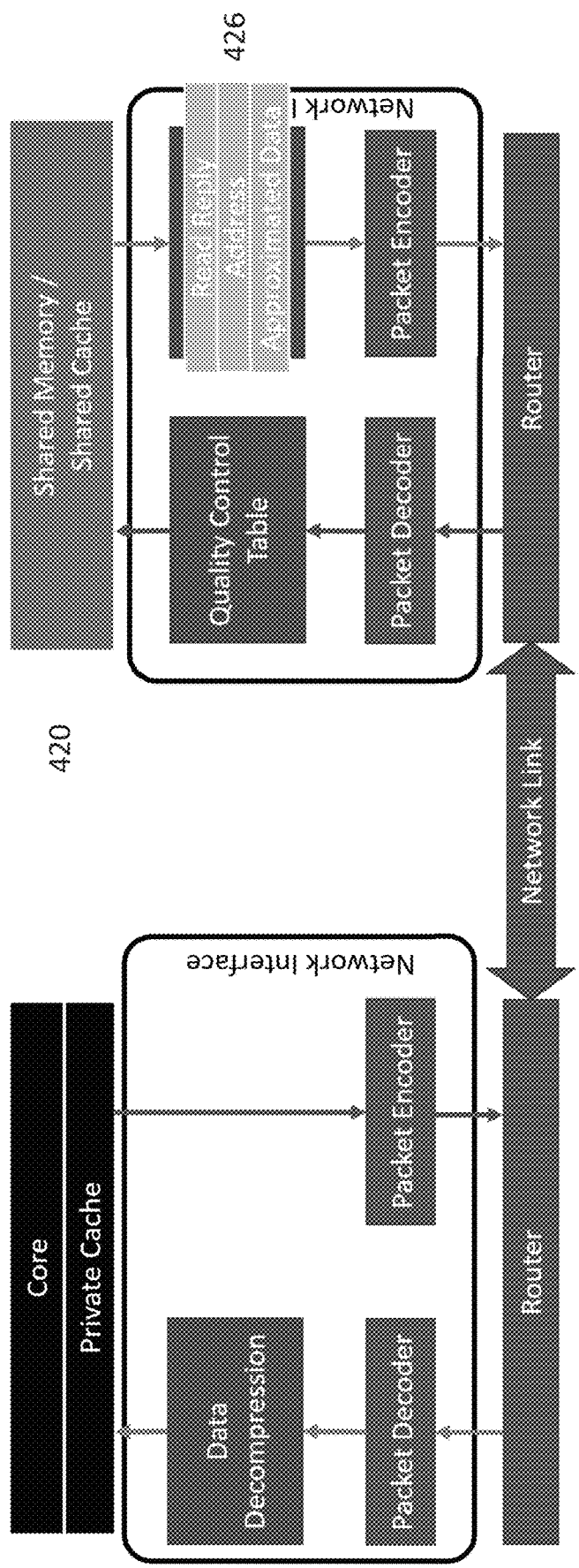
Figure 6K:
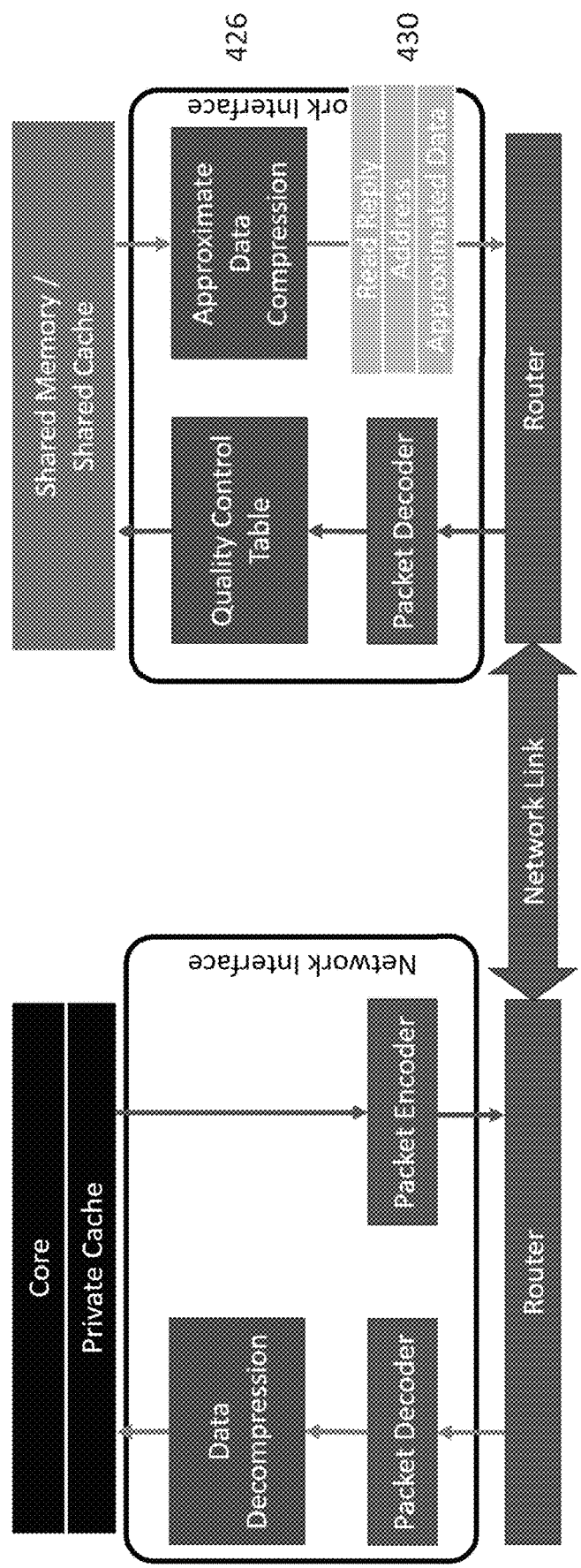
Figure 6L:
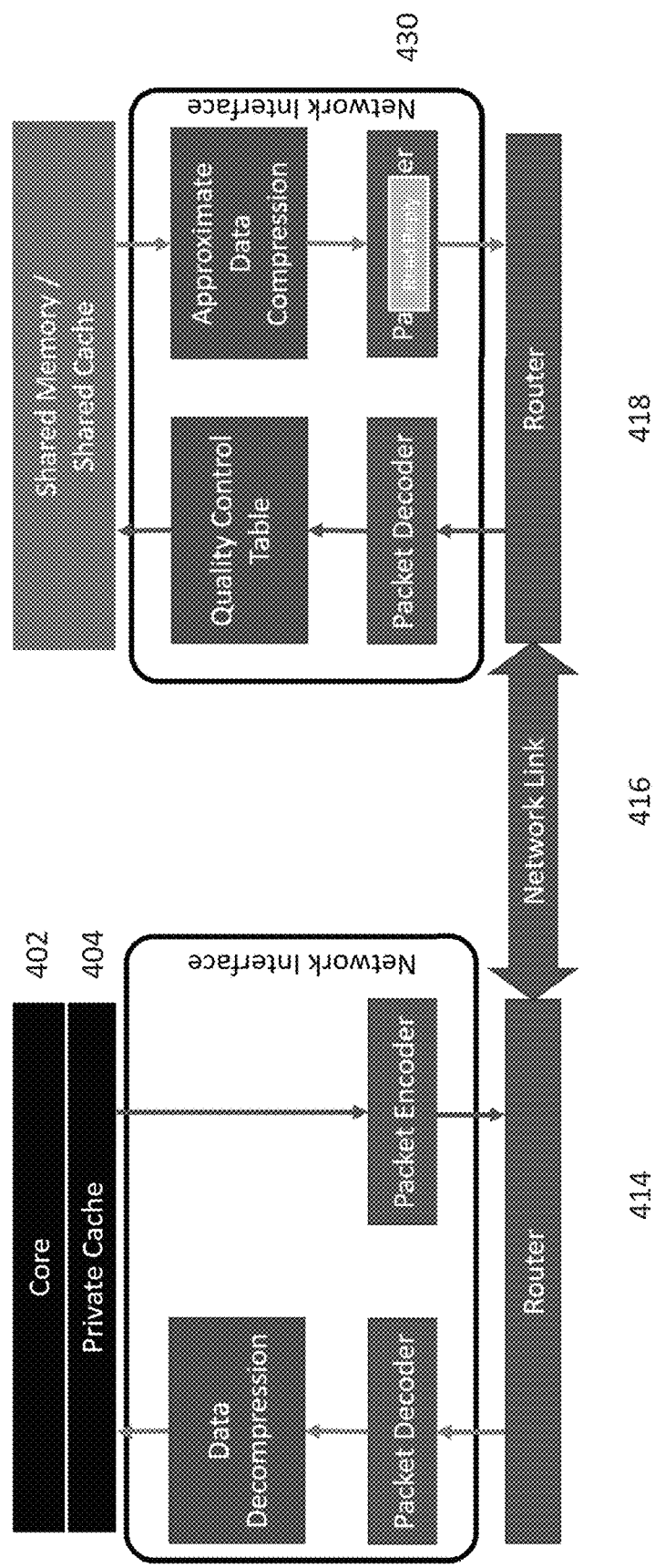
Figure 6M:
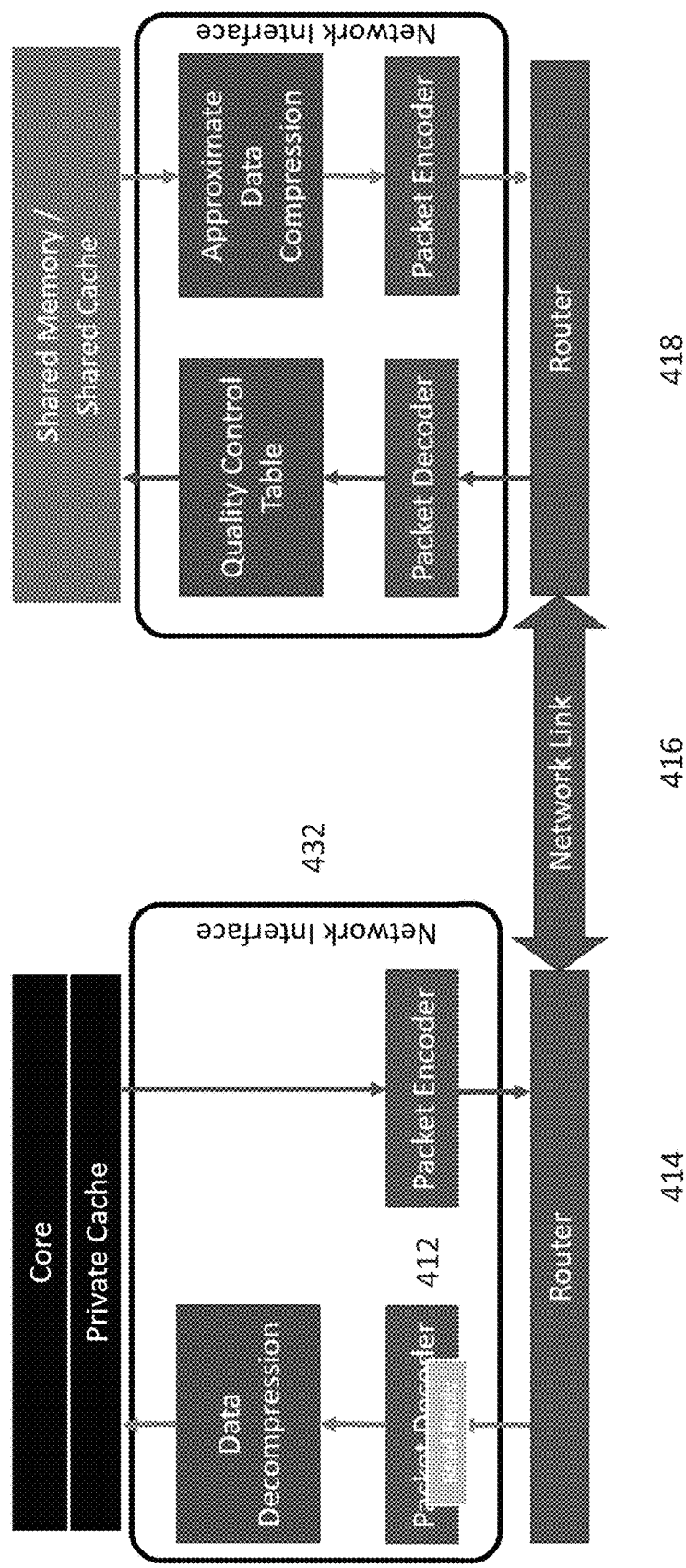
Figure 6N:
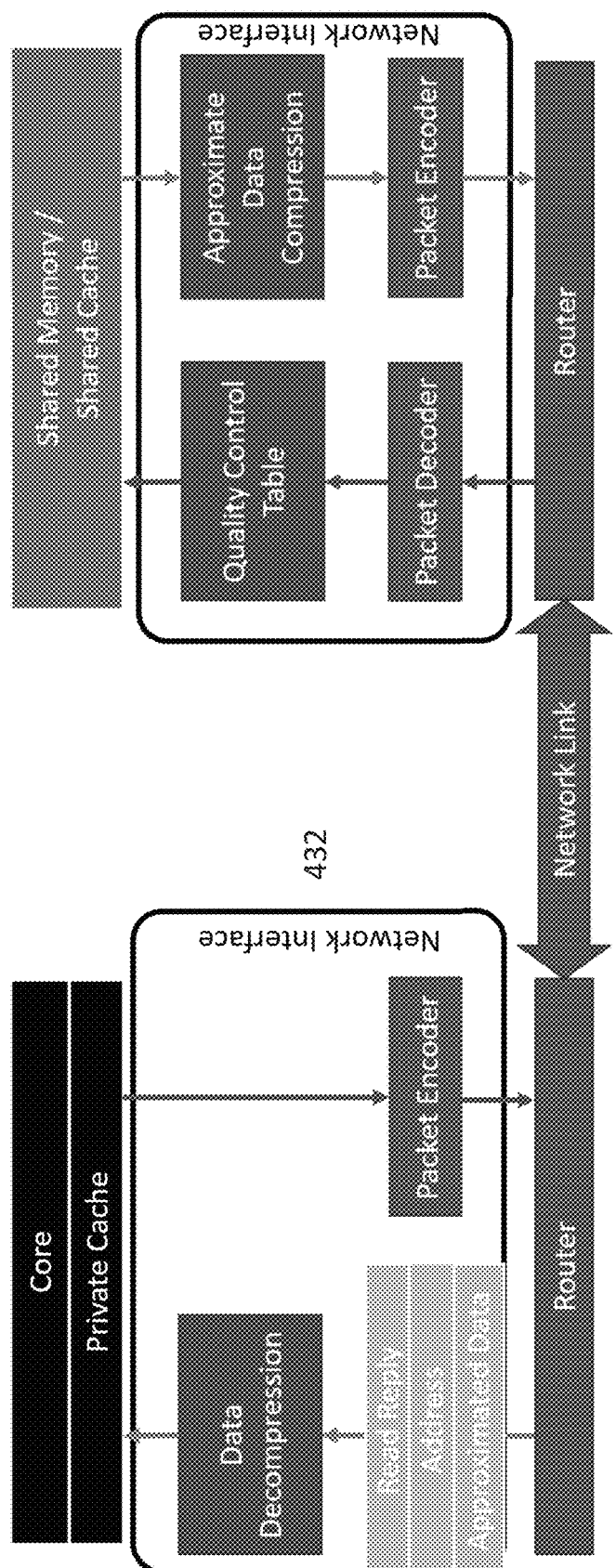
Figure 6O:
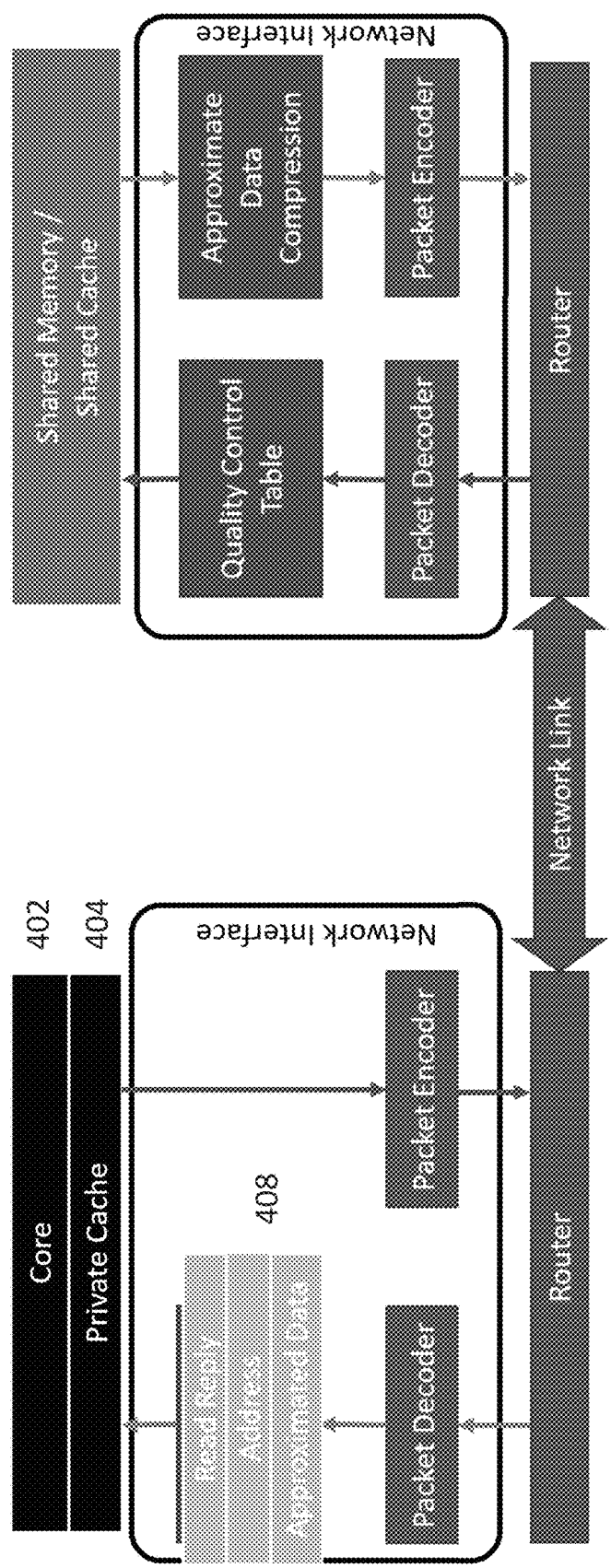

FIG. 6A-6O show a stepwise process by which the approximate communication system operates with regard to a read request. As shown in FIG. 6A, when the core 402 reads data from memory and misses the L1 cache, the read request, which is comprised of address and approximation information, is transmitted from the core 402 and private cache 404 to the packet encoder 410. The transmission of the read request to the packet encoder 410 is shown in FIGS. 6B and 6C.

Figure 7:
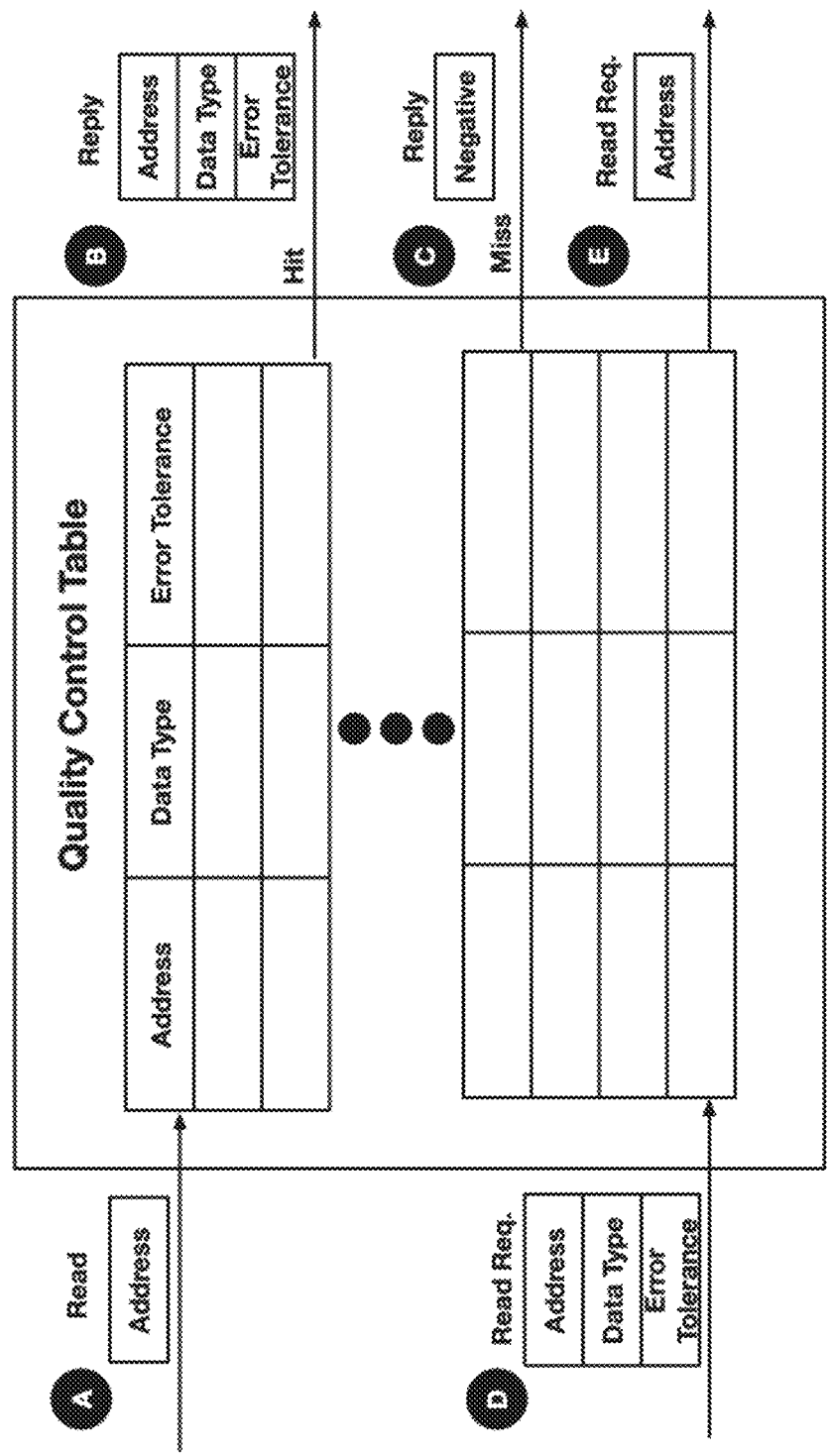
FIG. 7 is a diagram illustrating the hardware design of the quality control table in accordance with an embodiment of the invention.

At FIG. 6D, the read request packet is transmitted through multiple routers in the on-chip network 416 from a first router 414 to a second router 418. The read request packet is transmitted from the second router 418 and received by the network interface 434 at shared memory/shared cache and passes to the packet decoder 428. As shown in FIG. 6E, the read request packet is comprised of address and approximation information, which includes error tolerance and data type, as shown in FIG. 7.

As shown in FIG. 6F, the read request packet, comprised of address and approximation information, is transmitted from the packet decoder 428 to the quality control table 424. When the network interface at the memory or shared cache node 434 receives the read request packet, the packet decoder 428 extracts the address and approximation information from the packet. Then, as shown in FIG. 6G, the address is sent to the memory or shared cache 420 to collect the data.

As shown in FIG. 6H, the address and data are received at the memory or shared cache 420, while the approximation information is stored in the quality control table 424. Then, as shown at FIG. 6I, the network interface, at the approximate data compression logic module 426 approximates the data based on the approximation information stored in the quality control table 424. As shown in FIG. 6J, the approximate data compression logic module 426 then creates a read reply that is comprised of address information and approximated data.

As shown in FIG. 6K, the read reply and its address information and approximated data are transmitted to the packet encoder 430. Then, as shown in FIG. 6L, the packet encoder 430 packs the approximated data into the read reply packet and sends back to the core 402 through the second router 418, the network link 416, and the first router 414.

As shown in FIG. 6M, the packet decoder 412 decodes the read reply packet that is received through the network link 416 and the first router 414. The packet decoder 412 decodes the read reply packet into its address and approximated data, as shown in FIG. 6N The read reply packet and its address and approximated data then pass through the data decompression logic module 408, which recovers the approximated data and transmits it to the L1 cache 404 and the core 402.

FIG. 7 shows the hardware design of the quality controllable 424 at the shared cache or shared memory node 420. The quality control table consists of 3 columns of approximation information: addresses, data types, and error thresholds. The data type column describes the structure of the approximable data (e.g. integer, floating point, etc.).

In the network interface of the shared cache or shared memory node, the data approximation logic module 426 receives a read packet (A) containing an address in the quality control table 424 from which to acquire the approximation information for the data. If the address matches an entry in the quality control table 424, then the table sends a read reply packet with the corresponding approximation information, which includes the address, data type, and error tolerance (B). Then, the corresponding entry is deleted from the table after the reply packet (B) is sent. Otherwise, a negative signal (C) is sent to the data approximation logic module 426 to indicate that these data require accurate transmission. When a read request packet (D) arrives at the quality control table, the table first checks whether it contains approximation information. If so, the table extracts and registers the approximation information. If the requested data contains multiple data types, multiple entries in the quality control table 424 are occupied to store approximation information. Then, the quality control table forwards the read request (E), which now contains only the address, to the shared cache or shared memory.

The foregoing description and drawings should be considered as illustrative only of the principles of the disclosure. The disclosure is not intended to be limited by the preferred embodiment and may be implemented in a variety of ways that will be clear to one of ordinary skill in the art. Numerous applications of the disclosure will readily occur to those skilled in the art. Therefore, it is not desired to limit the disclosure to the specific examples disclosed or the exact construction and operation shown and described. Rather, all suitable modifications and equivalents may be resorted to, falling within the scope of the disclosure. All references cited herein are incorporated in their entireties.

The invention claimed is:

1. An approximate communication system for network-on-chips comprising:
a multi-core processor, wherein said multi-core processor comprises a code analyzer module that:
identifies one or more error-resilient variables in a code of interest prior to code execution, wherein the error-resilient variables comprise a subset of the data generated when the code of interest is executed;
generates a data dependency graph to calculate an error threshold for each of the one or more error-resilient variables;
appends an approximation instruction to each of the one or more error-resilient variables;
updates assembly code to incorporate the approximation instruction; and
compresses a data packet comprised of the approximation function prior to transmitting the data packet.

2. The system of claim 1, wherein the error threshold is dependent on an application's quality requirements.

3. The system of claim 1, wherein the approximation instruction loads and stores the one or more error-resilient variables in memory.

4. The system of claim 1, wherein the approximation instruction includes approximation information that is comprised of address data, variable data type, and error threshold data.

5. The system of claim 1, wherein the multi-core processor writes the data packet to a shared memory or shared cache.

6. The system of claim 1, wherein the multi-core processor compresses data in the write request using the approximation function in a network interface at a core and a private cache node.

7. The system of claim 6, wherein the multi-core processor further decompresses data in the write request in the network interface at a shared cache and a shared memory node.

8. The system of claim 7, wherein the multi-core processor further reads a data packet from the shared memory or the shared cache.

9. The system of claim 8, wherein the data packet read from the shared memory or the shared cache is received at a shared memory.

10. The system of claim 9, wherein a quality control table at the shared memory extracts approximation information comprising address data from the read request packet.

11. The system of claim 10, wherein a read reply data packet is approximated if the address data is matched to an entry in the quality control table.

12. The system of claim 11, wherein the matched entry in the quality control table is deleted.

13. The system of claim 11, wherein the read reply packet is received at the core and private cache.

14. The system of claim 13, wherein the data in the read reply packet is decompressed in a network interface at the core and private cache node.

15. A method for approximate communication for network-on-chips comprising:
identifying one or more error-resilient variables in a code of interest prior to code execution, wherein the error-resilient variables comprise a subset of the data generated when the code of interest is executed;
generates a data dependency graph to calculate an error threshold for each of the one or more error-resilient variables;
appending an approximation instruction to each of the one or more error-resilient variables;
updating assembly code to incorporate the approximation instruction; and
compressing a data packet comprised of the approximation function prior to transmitting the data packet.

16. The method of claim 15, wherein the error threshold is dependent on an application's quality requirements.

17. The method of claim 15, wherein the approximation instruction loads and stores the one or more error-resilient variables in memory.

18. The method of claim 15, wherein the approximation instruction includes approximation information that is comprised of address data, variable data type, and error threshold data.

19. The method of claim 15, further comprising writing the data packet to a shared memory or shared cache.

* * * * *